US010958018B2

(12) United States Patent
De Dios et al.

(10) Patent No.: US 10,958,018 B2
(45) **Date of Patent: *Mar. 23, 2021**

(54) SHIELDED TELECOMMUNICATIONS CONNECTOR

(71) Applicant: CommScope Connectivity Spain, S.L., Madrid (ES)

(72) Inventors: Longinos De Dios, Barcelona (ES); Manuel Urbano León, Barcelona (ES)

(73) Assignee: CommScope Connectivity Spain, S.L., Alcobendas (ES)

( * ) Notice: Subject to any disclaimer, the term of this patent is extended or adjusted under 35 U.S.C. 154(b) by 0 days.

This patent is subject to a terminal disclaimer.

(21) Appl. No.: 16/678,593

(22) Filed: Nov. 8, 2019

(65) Prior Publication Data

US 2020/0136319 A1 Apr. 30, 2020

Related U.S. Application Data

(63) Continuation of application No. 15/983,732, filed on May 18, 2018, now Pat. No. 10,498,088, which is a (Continued)

(30) Foreign Application Priority Data

Apr. 1, 2014 (ES) ................................ ES201430474

(51) Int. Cl.

*H01R 13/6592* (2011.01)
*H01R 4/20* (2006.01)

(Continued)

(52) U.S. Cl.

CPC ......... *H01R 13/6592* (2013.01); *H01R 4/206* (2013.01); *H01R 13/5808* (2013.01);

(Continued)

(58) Field of Classification Search

CPC ............ H01R 13/6592; H01R 13/5808; H01R 13/658; H01R 4/206; H01R 43/04; H05K 999/99

(Continued)

(56) References Cited

U.S. PATENT DOCUMENTS 3,246,284 A 4/1966 Farison
3,521,224 A 7/1970 Spooren (Continued)

FOREIGN PATENT DOCUMENTS

CN 2358584 Y 1/2000
CN 1947309 A 4/2007

(Continued)

OTHER PUBLICATIONS

International Search Report and Written Opinion of the International Searching Authority for International Patent Application No. PCT/EP2015/057196 dated Jul. 16, 2015, 14 pages.

(Continued)

*Primary Examiner* — Harshad C Patel
(74) *Attorney, Agent, or Firm* — Merchant & Gould P.C.

(57) ABSTRACT

A telecommunications connector includes a connector body and a shield attached to the connector body, the shield including a main body portion configured for attachment to the connector body and a barrel portion for crimping against a cable to be terminated to the connector. The barrel portion of the shield includes a corrugated side wall made up of a series of bends extending along a direction from the rear end of the barrel toward the front end of the barrel along at least a portion of a length of the barrel, wherein the bends defining the corrugated side wall are provided on the shield at a pre-crimped stage.

4 Claims, 21 Drawing Sheets

Related U.S. Application Data continuation of application No. 15/301,297, filed as application No. PCT/EP2015/057196 on Apr. 1, 2015, now Pat. No. 9,979,133.

(51) Int. Cl.
*H01R 13/58* (2006.01)
*H01R 13/658* (2011.01)
*H01R 43/04* (2006.01)

(52) U.S. Cl.
CPC .......... *H01R 13/658* (2013.01); *H01R 43/04* (2013.01); *H05K 999/99* (2013.01)

(58) Field of Classification Search
USPC ........................................................ 439/607.5
See application file for complete search history.

(56) References Cited

U.S. PATENT DOCUMENTS

| | | | | |
|---|---|---|---|---|
| 3,793,616 | A * | 2/1974 | Moehrke | H01R 24/20 439/854 |
| 3,918,789 | A | 11/1975 | Davis | |
| 4,136,922 | A | 1/1979 | Grebik | |
| 4,142,771 | A | 3/1979 | Barnes et al. | |
| 4,692,122 | A | 9/1987 | Montalbano | |
| 4,932,906 | A | 6/1990 | Kaley et al. | |
| 4,981,447 | A * | 1/1991 | Ichitsubo | H01R 13/65912 439/607.23 |
| 5,052,949 | A | 10/1991 | Lopata et al. | |
| 5,232,380 | A | 8/1993 | Inoue et al. | |
| 5,380,224 | A | 1/1995 | DiCicco | |
| 6,059,607 | A | 5/2000 | Wilson | |
| 7,041,907 | B2 | 5/2006 | Miyazaki | |
| 7,445,001 | B2 * | 11/2008 | Sikora | H01R 13/111 123/634 |
| 7,874,865 | B2 * | 1/2011 | Tobey | H01R 13/5837 439/460 |
| 7,909,647 | B2 | 3/2011 | Kawaguchi et al. | |
| 8,834,201 | B2 | 9/2014 | Miyawaki et al. | |
| 2004/0144557 | A1 | 7/2004 | Miyazaki | |
| 2007/0254529 | A1 * | 11/2007 | Pepe | H01R 13/6464 439/676 |
| 2012/0322307 | A1 | 12/2012 | Kudo | |
| 2014/0190744 | A1 | 7/2014 | Fuzioka | |

FOREIGN PATENT DOCUMENTS

| | | | |
|---|---|---|---|
| CN | 2938468 | Y | 8/2007 |
| CN | 201178208 | Y | 4/2009 |
| CN | 101461103 | A | 6/2009 |
| CN | 101595601 | A | 12/2009 |
| CN | 201408881 | Y | 2/2010 |
| CN | 101958484 | A | 1/2011 |
| CN | 102170075 | A | 8/2011 |
| CN | 102246358 | A | 11/2011 |
| CN | 202221834 | U | 5/2012 |
| CN | 102544857 | A | 7/2012 |
| CN | 102870299 | A | 1/2013 |
| DE | 203 17 981 | U1 | 5/2004 |
| EP | 0 427 630 | A1 | 5/1991 |
| EP | 1 028 486 | A2 | 8/2000 |
| JP | 11-329521 | A | 11/1999 |
| WO | 2009/016429 | A2 | 2/2009 |

OTHER PUBLICATIONS

Chinese Office Action for corresponding Chinese Patent Application No. 201580023245.9 dated Jun. 4, 2018, 11 pages.

European Office Action for corresponding European Patent Application No. 15714476.7, dated Dec. 7, 2018, 6 pages.

* cited by examiner

SHIELDED TELECOMMUNICATIONS CONNECTOR

CROSS-REFERENCE TO RELATED APPLICATION

This application is a Continuation of U.S. patent application Ser. No. 15/983,732, filed on May 18, 2018, now U.S. Pat. No. 10,498,088, which is a Continuation of U.S. patent application Ser. No. 15/301,297, filed on Sep. 30, 2016, now U.S. Pat. No. 9,979,133, which is a National Stage Application of PCT/EP2015/057196, filed on Apr. 1, 2015, which claims priority to Spanish Patent Application Serial No. P201430474 filed on Apr. 1, 2014, and which applications are incorporated herein by reference. To the extent appropriate, a claim of priority is made to each of the above disclosed applications.

FIELD

The present disclosure generally relates to telecommunications equipment. More specifically, the present disclosure relates to shielded connectors and methods of terminating cables to shielded connectors.

BACKGROUND

In electrical cables, the function of the cable braid is to protect the signal wires inside the cable against electromagnetic influences from outside. The braid may also be used for grounding purposes. A third important function of the braid is to give sufficient strain relief to the cable/connector combination.

Proper connection of a cable braid to the connector is important for stability, durability, and strength of the cable/connector unit. Long term electrical stability of the braid connection is important for the continuity and performance of the connectivity applications. Mechanical strength may also be required for the various environments where cable assemblies are provided. The available space in the connectivity applications further require that the braid connection uses limited space.

Improvements in connector shields for achieving stability, durability, and strength of the braid connection are desired.

SUMMARY

The present disclosure relates to a telecommunications connector having a shield with features that are examples of inventive aspects in accordance with the present disclosure and methods relating to the connection provided between the shield of the connector and the metallic braid of a cable.

It should be noted that although the present disclosure specifies electrical connectors and describes the inventive aspects of the different embodiments of the shields with respect to electrical connections, the inventive aspects are fully applicable to connections between fiber optic cables and fiber optic connectors or hybrid cables and hybrid connectors, wherein features such as protection against electro-magnetic interference, grounding, or strain relief might still be utilized.

According to one aspect of the present disclosure, the telecommunications connector includes a connector body and a shield attached to the connector body, the shield including a main body portion configured for attachment to the connector body and a barrel portion for crimping against a cable to be terminated to the connector. The barrel portion of the shield includes a corrugated side wall made up of a series of bends extending along a direction from the rear end of the barrel toward the front end of the barrel along at least a portion of a length of the barrel, wherein the bends defining the corrugated side wall are provided on the shield at a pre-crimped stage.

According to another aspect of the present disclosure, the telecommunications connector includes a connector body and a shield attached to the connector body, the shield including a main body portion configured for attachment to the connector body and a barrel portion for crimping against a cable to be terminated to the connector. The barrel portion of the shield includes a corrugated side wall made up of a series of bends extending along a direction from the rear end of the barrel toward the front end of the barrel along at least a portion of a length of the barrel, wherein the bends defining the corrugated side wall extend generally 360 degrees around the periphery of the barrel.

According to another aspect of the present disclosure, the telecommunications connector includes a connector body and a shield attached to the connector body, the shield including a main body portion configured for attachment to the connector body and a barrel portion for crimping against a cable to be terminated to the connector, wherein the barrel portion of the shield defines a unitary structure, the unitary structure including portions that radially overlap when the shield is at a pre-crimped stage.

According to another aspect, the disclosure is related to a shield for attachment to a telecommunications connector for crimping a cable to be terminated to the telecommunications connector, the shield including a main body portion configured for attachment to the connector and a barrel portion for crimping against the cable to be terminated to the connector. The barrel portion of the shield includes a corrugated side wall made up of a series of bends extending along a direction from the rear end of the barrel toward the front end of the barrel along at least a portion of a length of the barrel, wherein the bends defining the corrugated side wall are provided on the shield at a pre-crimped stage.

According to another aspect, the disclosure is related to a shield for attachment to a telecommunications connector for crimping a cable to be terminated to the telecommunications connector, the shield including a main body portion configured for attachment to the connector and a barrel portion for crimping against a cable to be terminated to the connector. The barrel portion of the shield includes a corrugated side wall made up of a series of bends extending along a direction from the rear end of the barrel toward the front end of the barrel along at least a portion of a length of the barrel, wherein the bends defining the corrugated side wall extend generally 360 degrees around the periphery of the barrel.

According to another aspect, the disclosure is related to a shield for attachment to a telecommunications connector for crimping a cable to be terminated to the telecommunications connector, the shield including a main body portion configured for attachment to the connector and a barrel portion for crimping against a cable to be terminated to the connector, wherein the barrel portion of the shield defines a unitary structure, the unitary structure including portions that radially overlap when the shield is at a pre-crimped stage.

According to another aspect, the disclosure is related to a method of terminating a cable to a telecommunications connector, the method comprising stripping a portion of a jacket of the cable to expose a plurality of wires of the cable, sliding a shield of the telecommunications connector over the cable that has a barrel portion defining a corrugated side wall made up of a series of bends extending along a direction from the rear end of the barrel toward the front end of the barrel along at least a portion of a length of the barrel, terminating the plurality of wires of the cable to the telecommunications connector so as to establish an electrical connection between the wires and contacts of the connector, and crimping the barrel portion of the shield over the jacket of the cable.

According to another aspect, the disclosure is related to a method of terminating a cable to a telecommunications connector, the method comprising stripping a portion of a jacket of the cable to expose a plurality of wires of the cable, sliding a shield of the telecommunications connector over the cable that has a barrel portion defining a corrugated side wall made up of a series of bends extending along a direction from the rear end of the barrel toward the front end of the barrel along at least a portion of the length of the barrel, wherein the bends defining the corrugated side wall extend generally 360 degrees around the periphery of the barrel, terminating the plurality of wires of the cable to the telecommunications connector so as to establish an electrical connection between the wires and contacts of the connector, and crimping the barrel portion of the shield over the jacket of the cable.

According to another aspect, the disclosure is related to a method of terminating a cable to a telecommunications connector, the method comprising stripping a portion of a jacket of the cable to expose a plurality of wires of the cable, sliding a shield of the telecommunications connector over the cable that has a barrel portion defining a unitary structure, the unitary structure including portions that radially overlap when the shield is at a pre-crimped stage, terminating the plurality of wires of the cable to the telecommunications connector so as to establish an electrical connection between the wires and contacts of the connector, and crimping the barrel portion of the shield over the jacket of the cable.

According to another aspect, the disclosure is related to a method of terminating a cable to a telecommunications connector, the method comprising sliding a shield of the telecommunications connector over the cable that has a barrel portion defining a corrugated side wall made up of a series of bends extending along a direction from the rear end of the barrel toward the front end of the barrel along at least a portion of a length of the barrel, and crimping the barrel portion of the shield over the cable. The telecommunications connector may be an electrical connector, a fiber optic connector, or a hybrid connector.

According to another aspect, the disclosure is related to a method of terminating a cable to a telecommunications connector, the method comprising sliding a shield of the telecommunications connector over the cable that has a barrel portion defining a corrugated side wall made up of a series of bends extending along a direction from the rear end of the barrel toward the front end of the barrel along at least a portion of the length of the barrel, wherein the bends defining the corrugated side wall extend generally 360 degrees around the periphery of the barrel, and crimping the barrel portion of the shield over the cable. The telecommunications connector may be an electrical connector, a fiber optic connector, or a hybrid connector.

According to another aspect, the disclosure is related to a method of terminating a cable to a telecommunications connector, the method comprising sliding a shield of the telecommunications connector over the cable that has a barrel portion defining a unitary structure, the unitary structure including portions that radially overlap when the shield is at a pre-crimped stage, and crimping the barrel portion of the shield over the cable. The telecommunications connector may be an electrical connector, a fiber optic connector, or a hybrid connector.

BRIEF DESCRIPTION OF THE DRAWINGS

The accompanying drawings, which are incorporated in and constitute a part of the description, illustrate several aspects of the inventive features and together with the detailed description, serve to explain the principles of the disclosure. A brief description of the drawings is as follows:

FIG. 37A is a close-up view illustrating portions of the sidewalls in

FIG. 37; and

DETAILED DESCRIPTION

Reference will now be made in detail to exemplary aspects of the present invention which are illustrated in the accompanying drawings. Wherever possible, the same reference numbers will be used throughout the drawings to refer to the same or similar parts.

Figure 1:
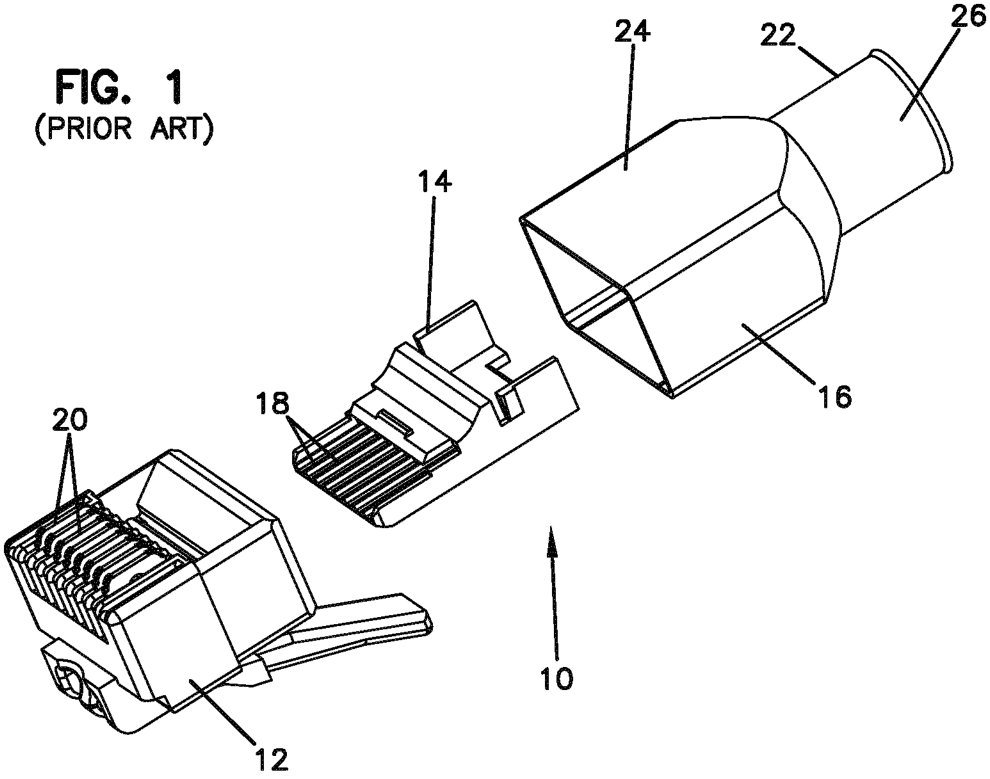
FIG. 1 (PRIOR ART)
FIG. 1 illustrates an exploded perspective view of a prior art electrical connector.

FIG. 1 illustrates a conventional registered jack (RJ) type electrical connector 10. The illustrated connector 10 includes a plug housing 12, a load bar 14, and a shield 16. The load bar 14 is a wire management device that is configured to align the individual wire pairs (e.g., of a twisted-pair cable) and to make sure that the correct cable length is used in terminating the wires of the cable to the connector 10. Once the individual wires are organized in the correct orientation and placed within pockets 18 of the load bar 14, the load bar 14 is positioned within the plug housing 12. When placed within the plug housing 12, the ends of the wires make electrical contact with plug contacts 20 located within the plug housing 12. The plug contacts 20 may include portions that are configured to pierce through the insulation of the cable wires in establishing an electrical connection. The plug contacts 20 are configured to provide electrical connection with spring contacts of a jack into which the connector 10 is plugged and provide an electrical pathway from the spring contacts to the wires of the cable.

When terminating the wires of the cable to this type of a connector, the cable is normally stripped, a metallic braid of the cable is folded back, and the shield 16 is slid over the free end of the cable. The metallic braid, as noted above, may provide protection against outside electro-magnetic interference for the cable. Also, in cooperation with the shield 16, the braid may be used to ground the cable and provide strain relief thereto.

The metallic braid is crimped to a barrel portion 22 of the shield 16 and the main body portion 24 of the shield 16 is mechanically coupled to the plug housing 12 to complete the assembly of the connector. In conventional registered jack (RJ) type electrical connectors such as the one illustrated, the shield 16 defines a completely closed, cylindrical barrel 22 made up of a smooth side wall 26. The fixed diameter of the barrel 22 limits the range of cables that may be crimped to the shield 16. The smooth side wall 26 of the barrel 22 can also be improved upon for increasing the strength of the barrel 22 for strain relief purposes.

Figure 2:
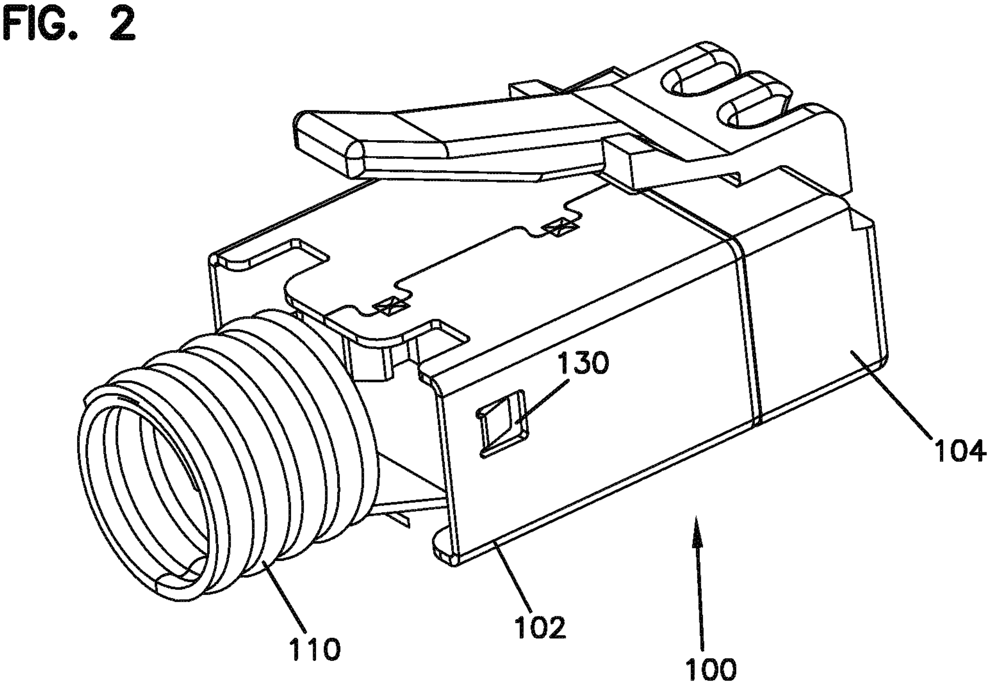
FIG. 2 is a top perspective view of an electrical connector having features that are examples of inventive aspects in accordance with the present disclosure.
Figure 3:
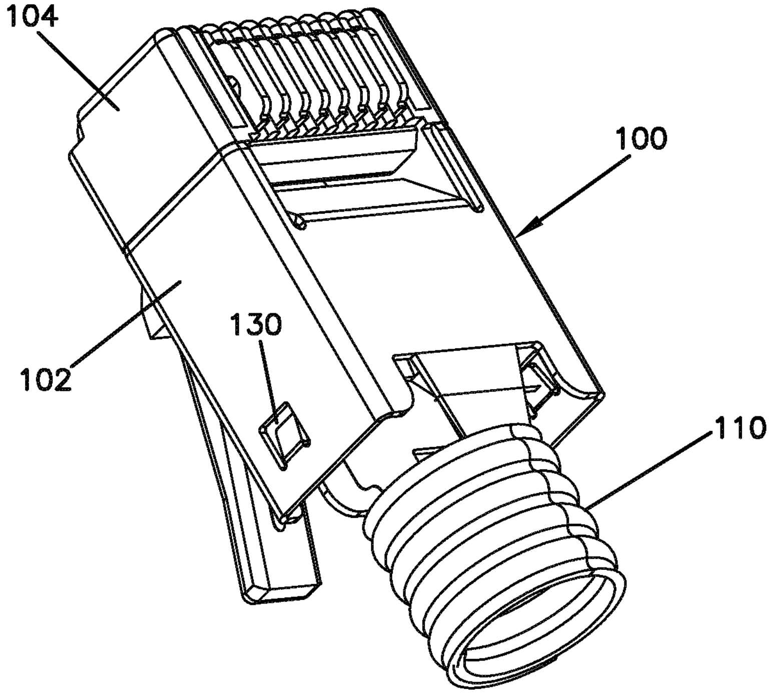
FIG. 3 is a bottom perspective view of the connector of FIG. 2.
Figure 4:
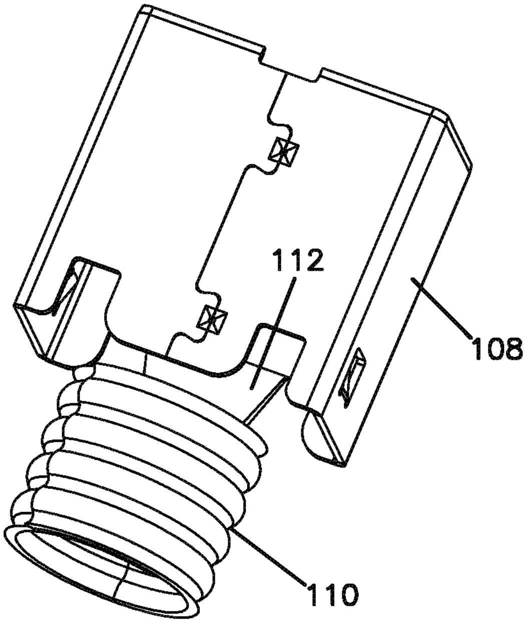
FIG. 4 is a top perspective view of a shield configured for use with the connector of FIG. 2.
Figure 5:
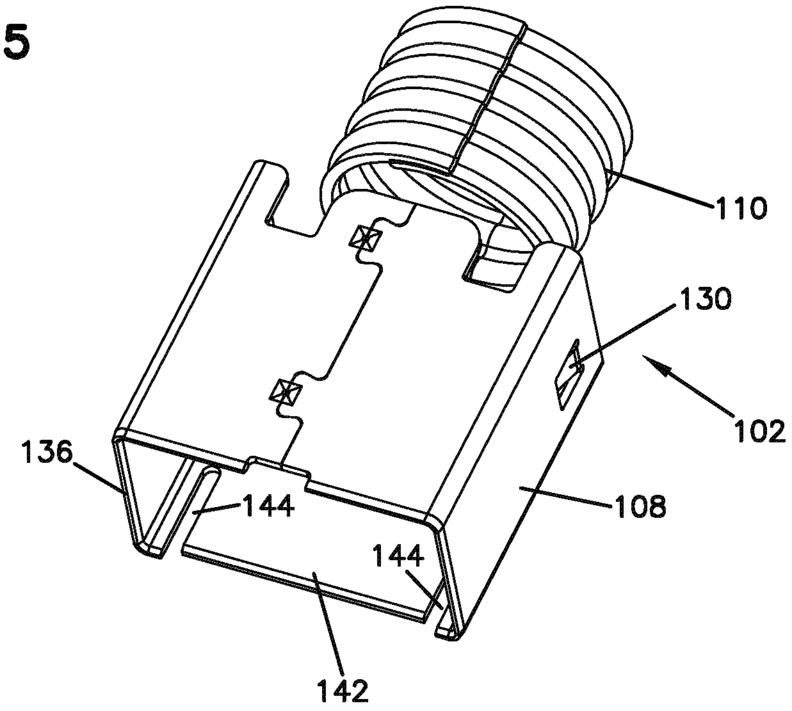
FIG. 5 is a top perspective view of the shield of FIG. 4.
Figure 6:
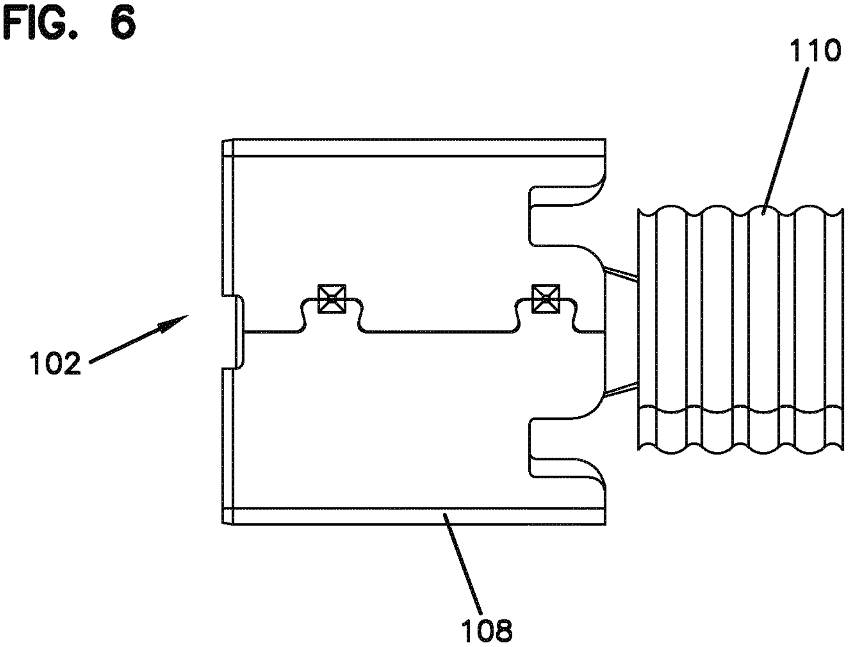
FIG. 6 is a top view of the shield of FIG. 4.
Figure 7:
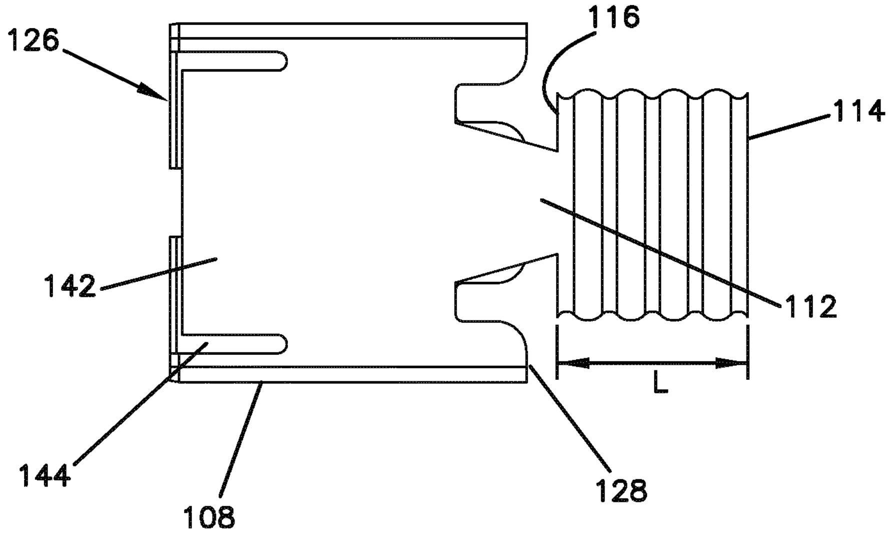
FIG. 7 is a bottom view of the shield of FIG. 4.
Figure 8:
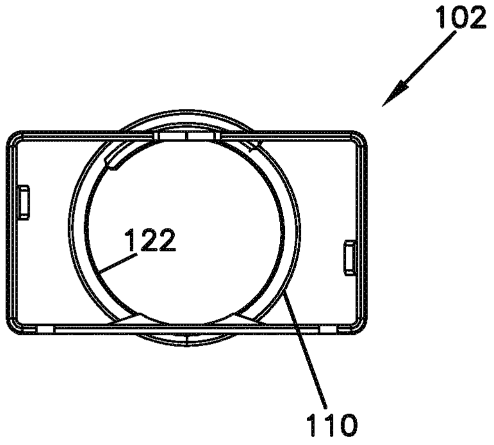
FIG. 8 is a front view of the shield of FIG. 4.
Figure 9:
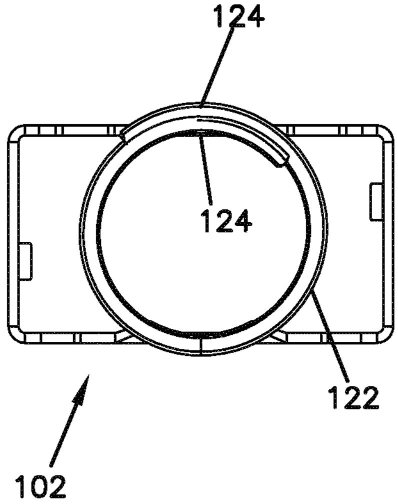
FIG. 9 is a rear view of the shield of FIG. 4.
Figure 10:
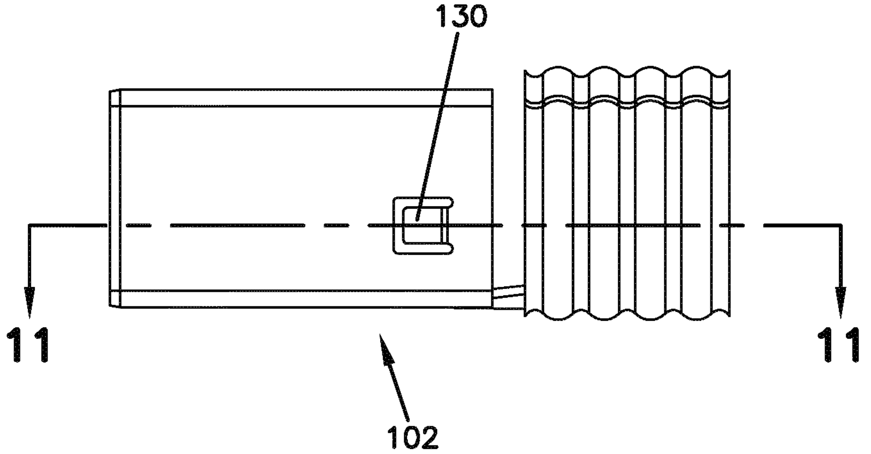
FIG. 10 is a side view of the shield of FIG. 4.
Figure 11:
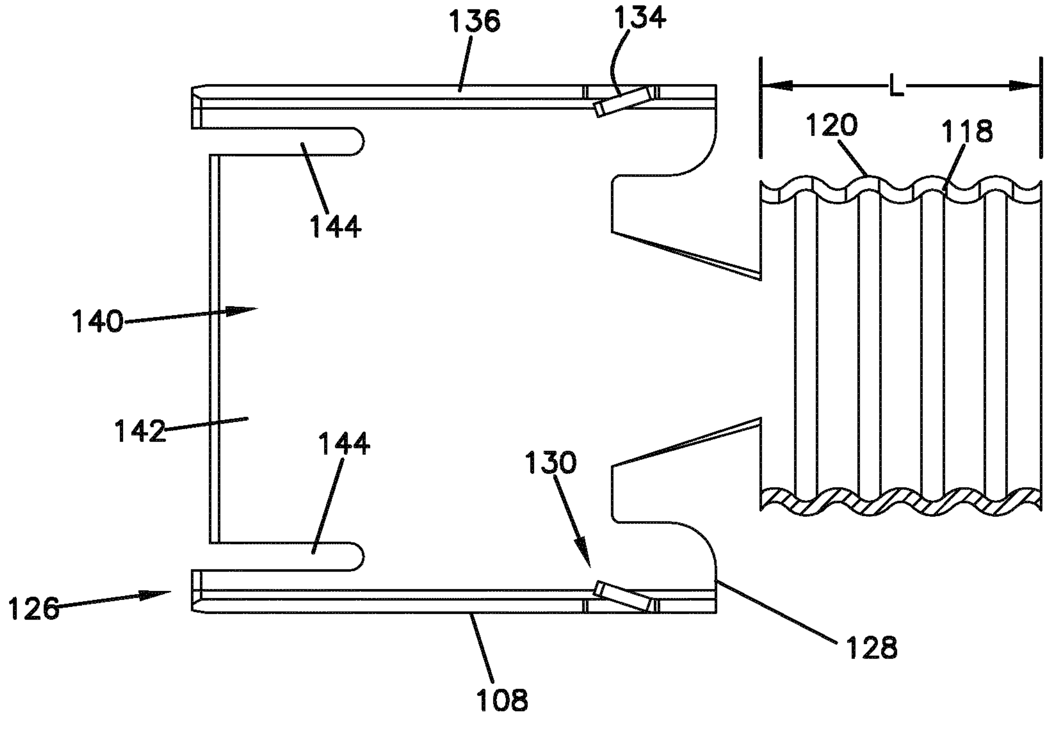
FIG. 11 is a cross-sectional view taken along line 11-11 of FIG. 10.

Referring now to FIGS. 2-3, an electrical connector 100 having features that are examples of inventive aspects in accordance with the disclosure is illustrated. The connector 100 includes an inventive shield 102 that is configured to be mechanically coupled to a conventional plug housing 104. The shield 102 is shown in isolation in FIGS. 4-12. FIGS. 13-18 illustrate another version of a shield 202 having similar features to the shield 102 of FIGS. 4-12, with the exception of the shield 202 of FIGS. 13-18 including different mechanical coupling features for connection to different types of conventional plug housings. FIGS. 19-25 illustrate yet another embodiment of an inventive shield 302 having features similar to the shields 102, 202 shown in FIGS. 4-18.

As will be discussed in further detail below, the shield 302 of FIGS. 19-25 is different than those shown in FIGS. 4-18 in that the shield 302 defines a barrel portion made up of separate upper and lower barrel halves that are configured to mate to form a fully enclosed cylindrical structure. When the upper and lower barrel halves are crimped against the cable, portions of the upper and lower halves overlap. In contrast, both versions of the inventive shields 102, 202 in FIGS. 4-18 define a barrel portion made up of a unitary structure that generally forms an enclosed cylindrical structure, wherein the unitary barrel includes portions that radially overlap both before and after the barrel is crimped against the braid of the cable.

Figure 12:
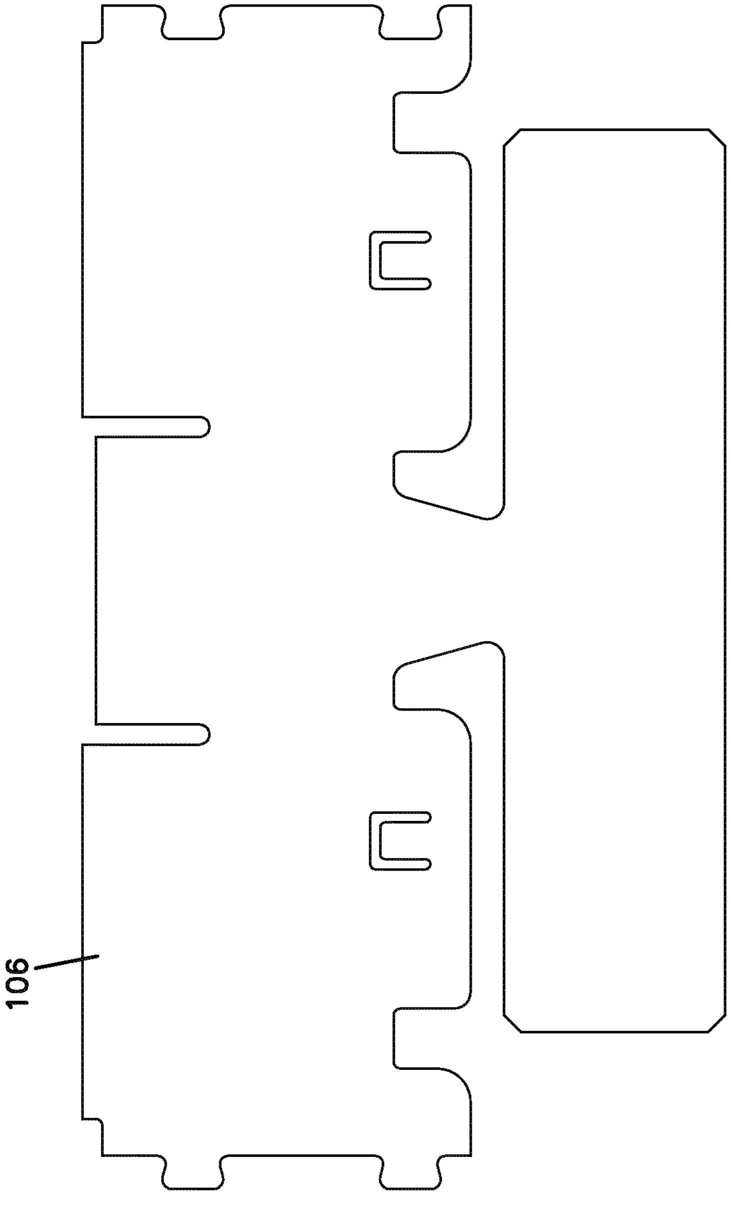
FIG. 12 illustrates the unitary sheet metal structure from which the shield of FIG. 4 is formed.
Figure 13:
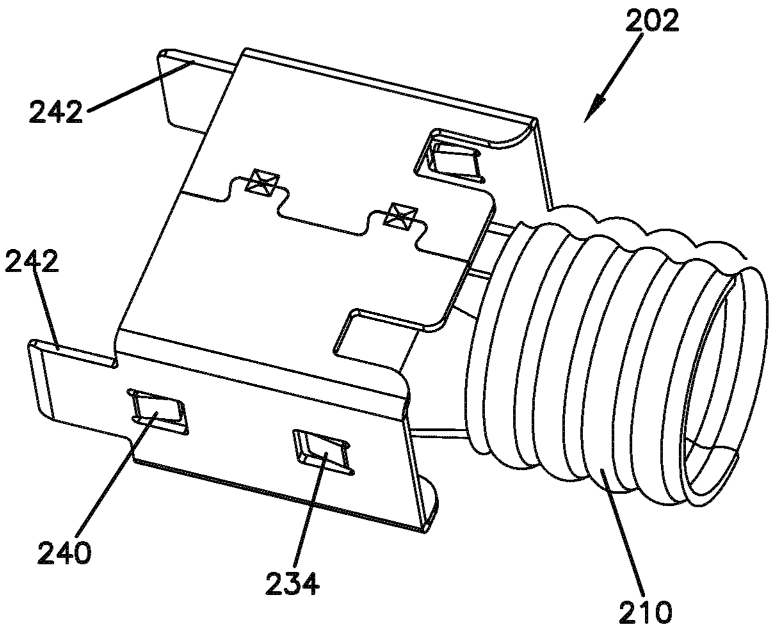
FIG. 13 is a top perspective of another embodiment of a shield having features that are examples of inventive aspects in accordance with the present disclosure, the shield having features similar to the shield of FIGS. 4-12.
Figure 14:
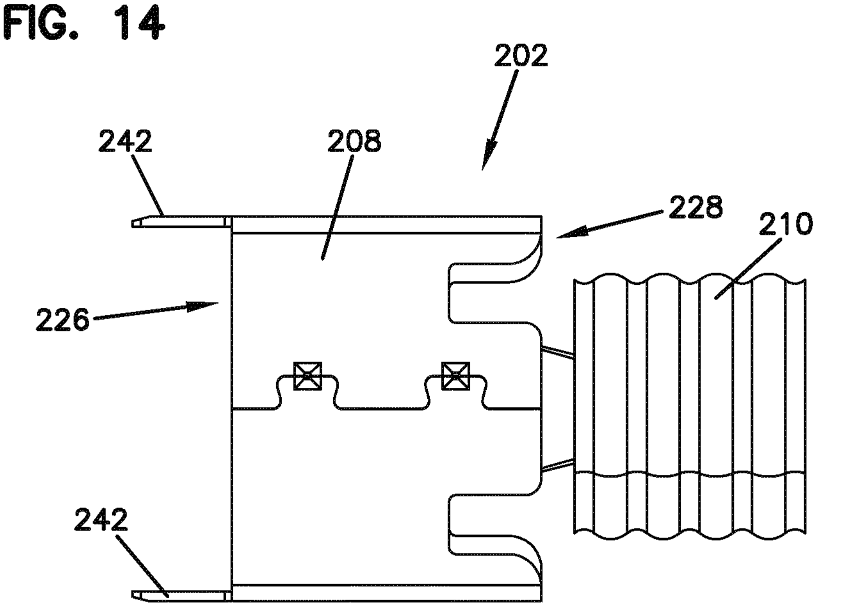
FIG. 14 is a top view of the shield of FIG. 13.
Figure 15:
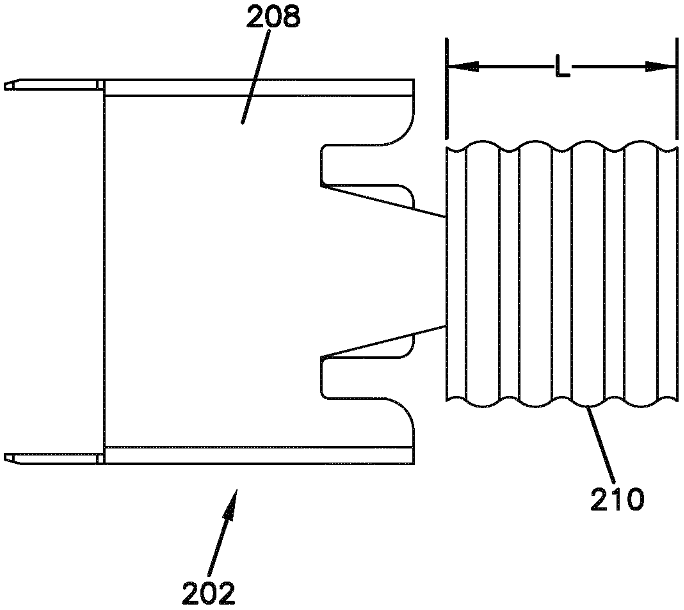
FIG. 15 is a bottom view of the shield of FIG. 13.
Figure 16:
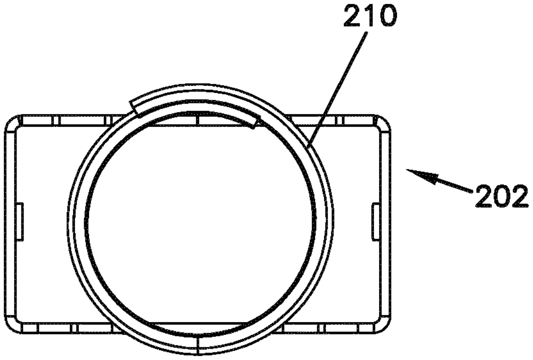
FIG. 16 is a rear view of the shield of FIG. 13.
Figure 17:
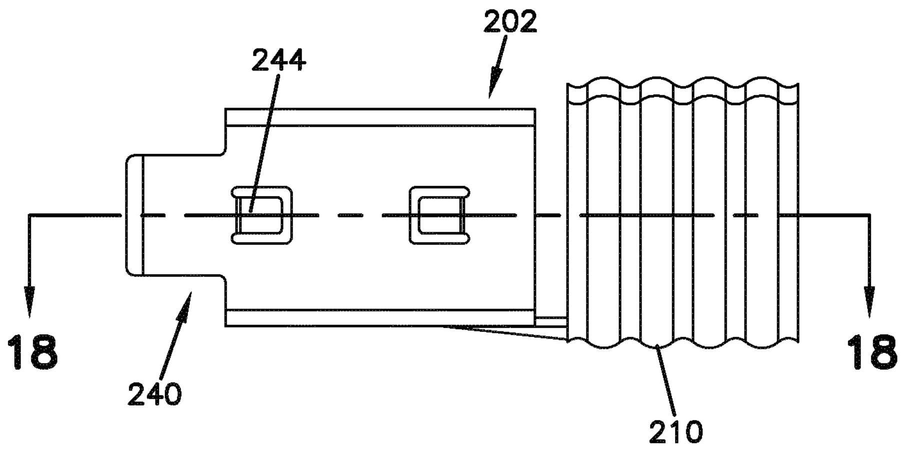
FIG. 17 is a side view of the shield of FIG. 13.
Figure 18:
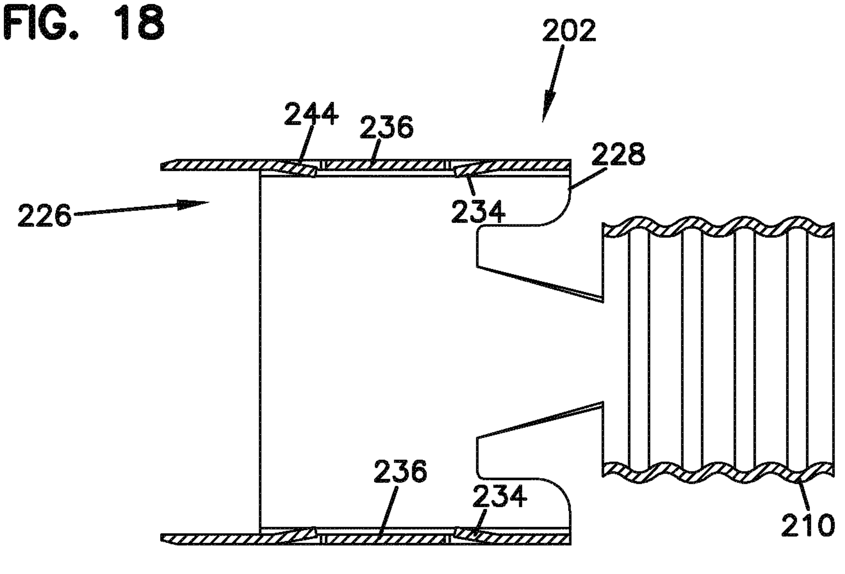
FIG. 18 is a cross-sectional view taken along line 18-18 of FIG. 17.
Figure 19:
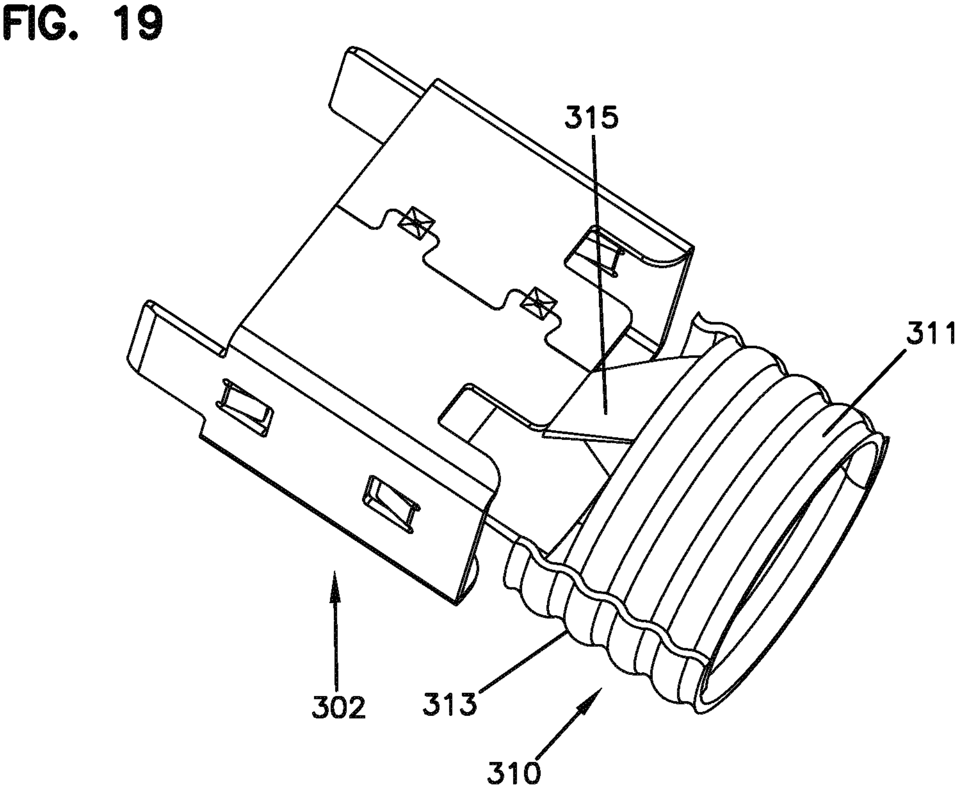
FIG. 19 is a top perspective of a third embodiment of a shield having features that are examples of inventive aspects in accordance with the present disclosure, the shield having features similar to the shield of FIGS. 13-18.
Figure 20:
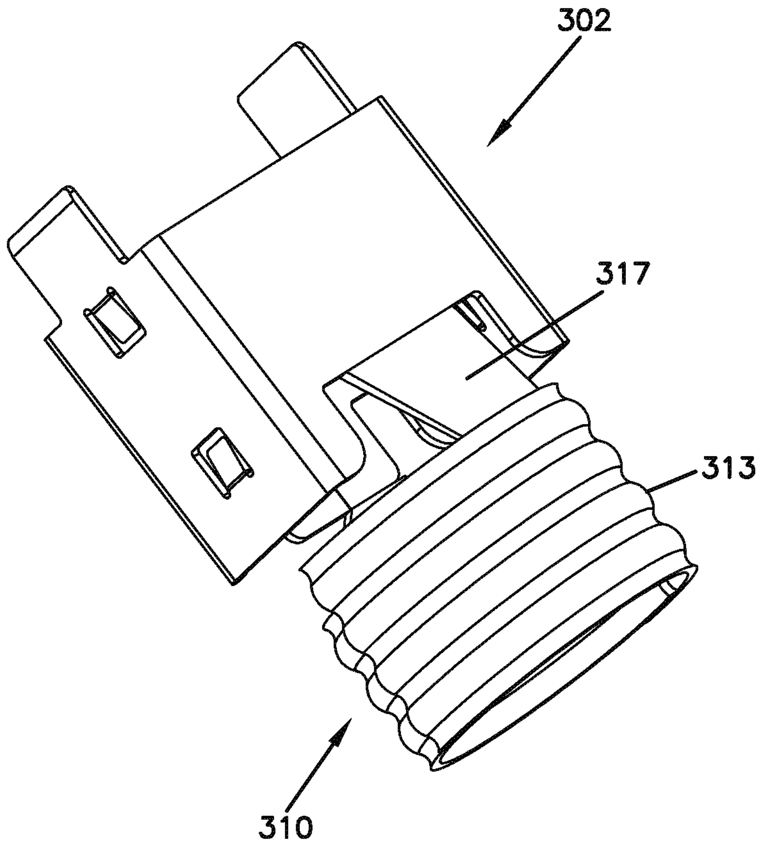
FIG. 20 is a bottom perspective view of the shield of FIG. 19.
Figure 21:
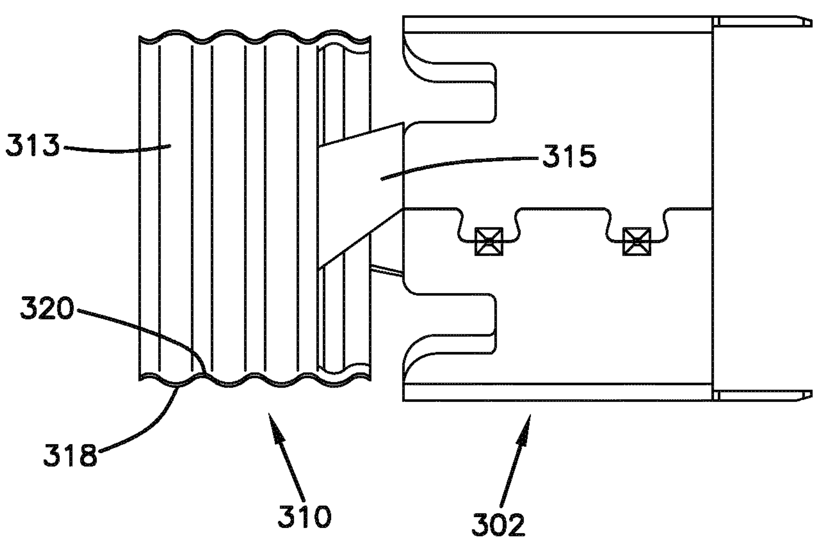
FIG. 21 is a top view of the shield of FIG. 19.
Figure 22:
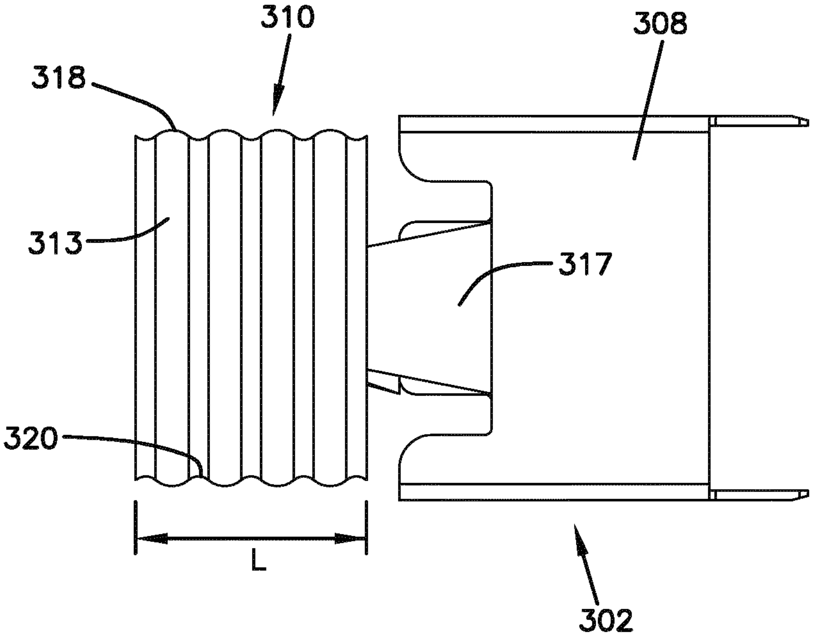
FIG. 22 is a bottom view of the shield of FIG. 19.
Figure 23:
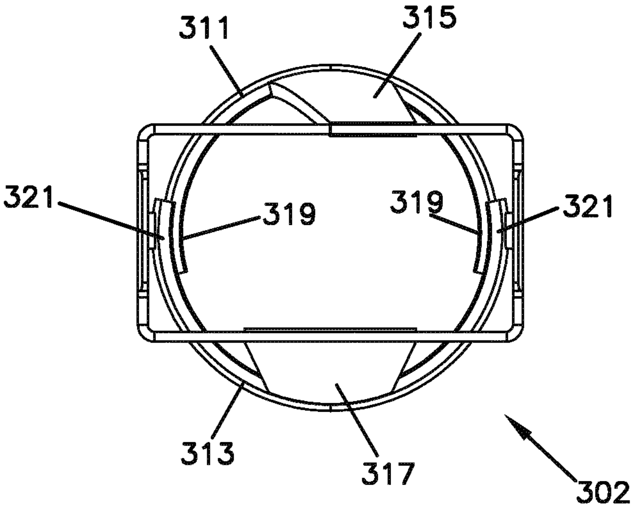
FIG. 23 is a front view of the shield of FIG. 19.
Figure 24:
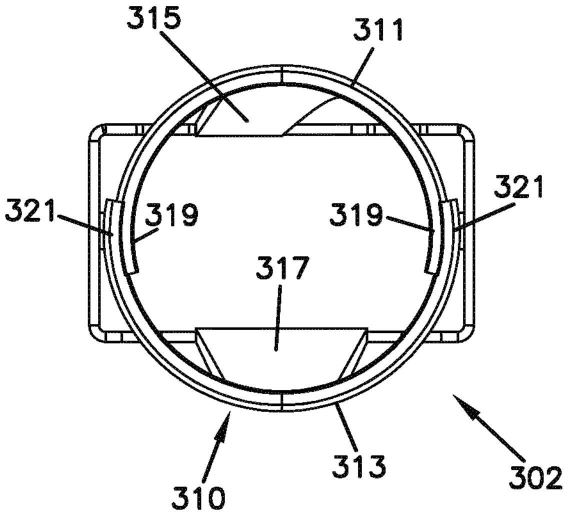
FIG. 24 is a rear view of the shield of FIG. 19.
Figure 25:
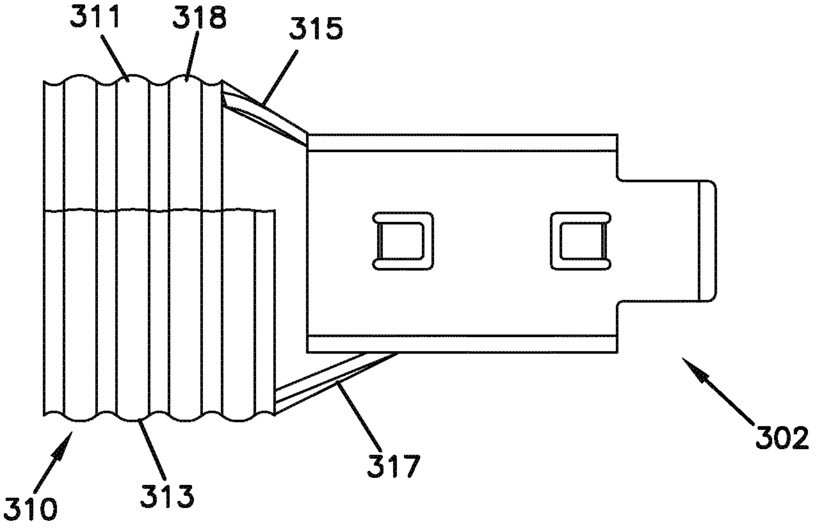
FIG. 25 is a side view of the shield of FIG. 19.
Figure 26:
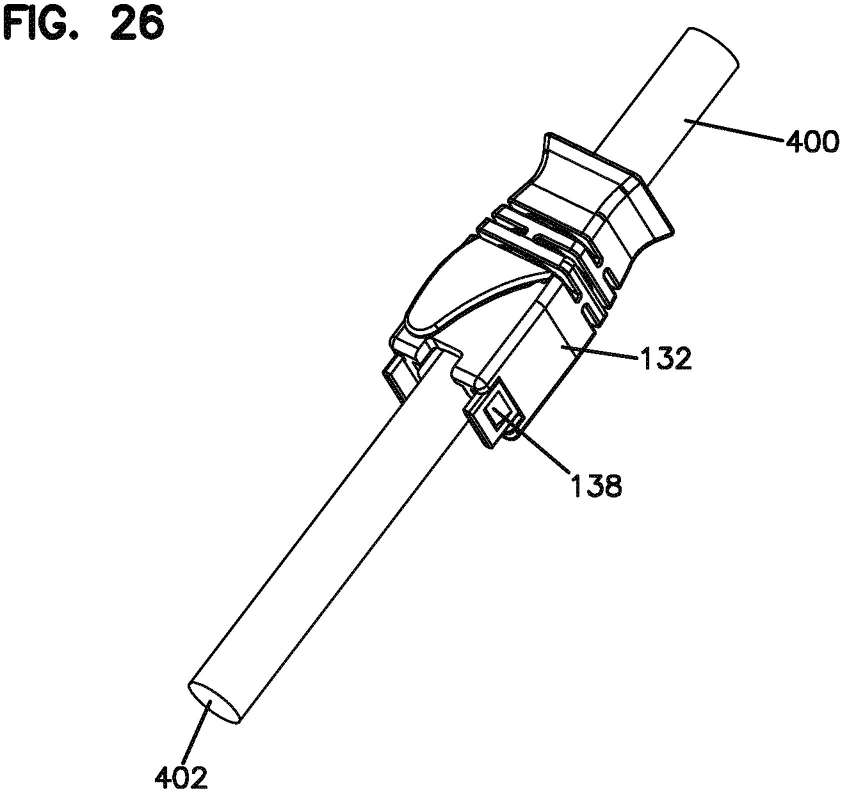
FIGS. 26-31 illustrate an example method of terminating an electrical cable to a connector with the shield illustrated in FIGS. 4-12.
Figure 27:
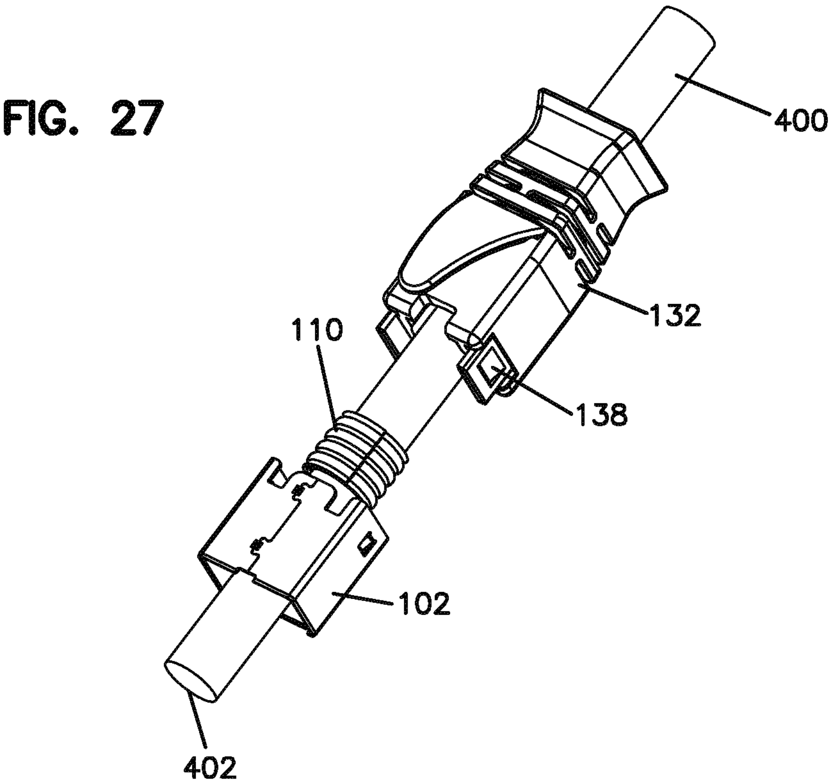
Figure 28:
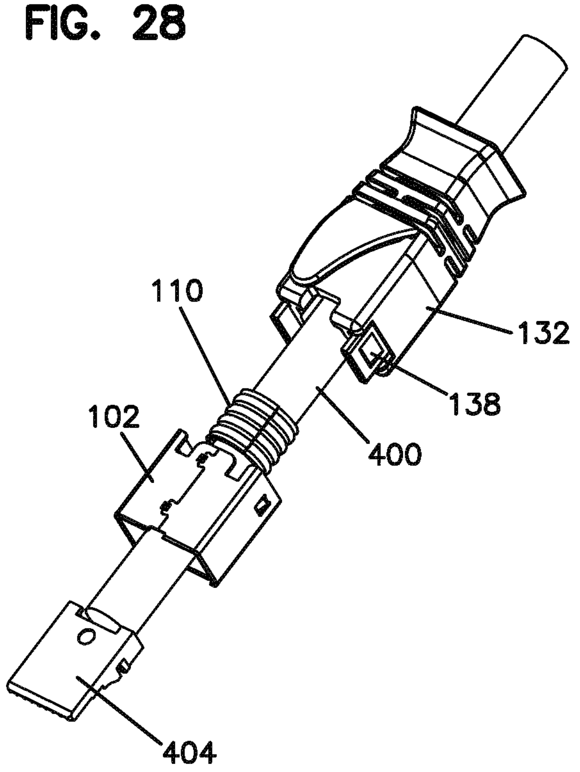
Figure 29:
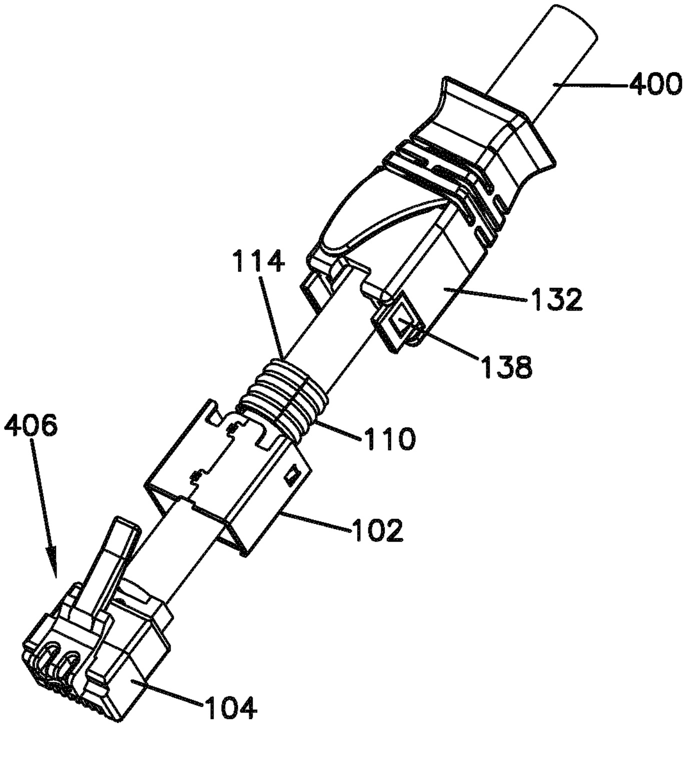
Figure 30:
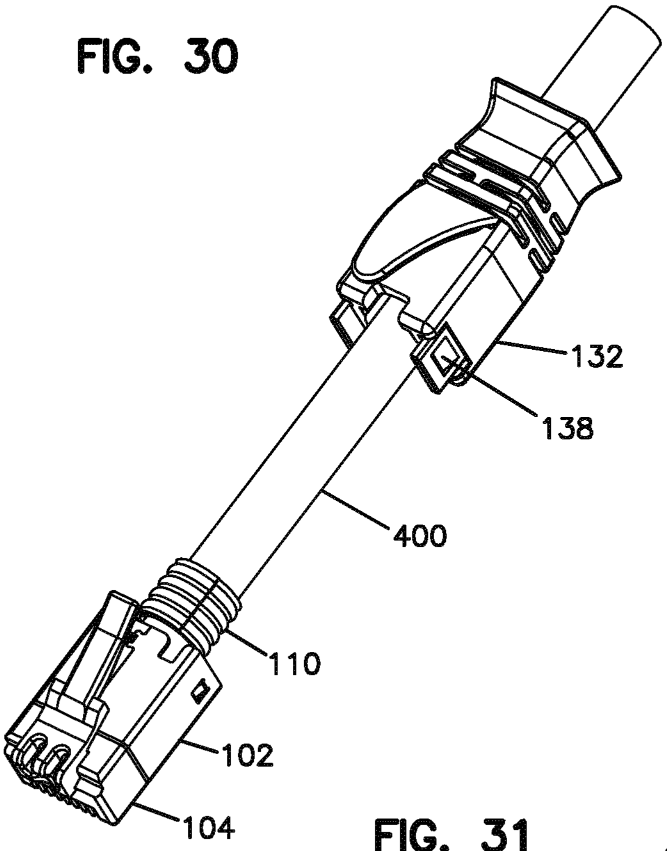
Figure 31:
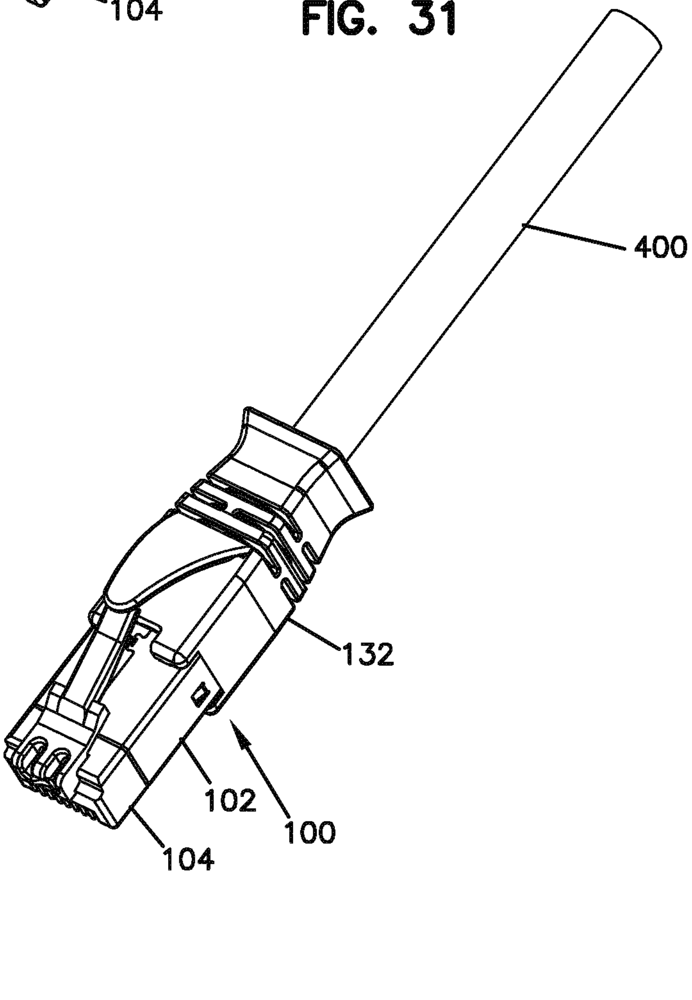
Figure 32:
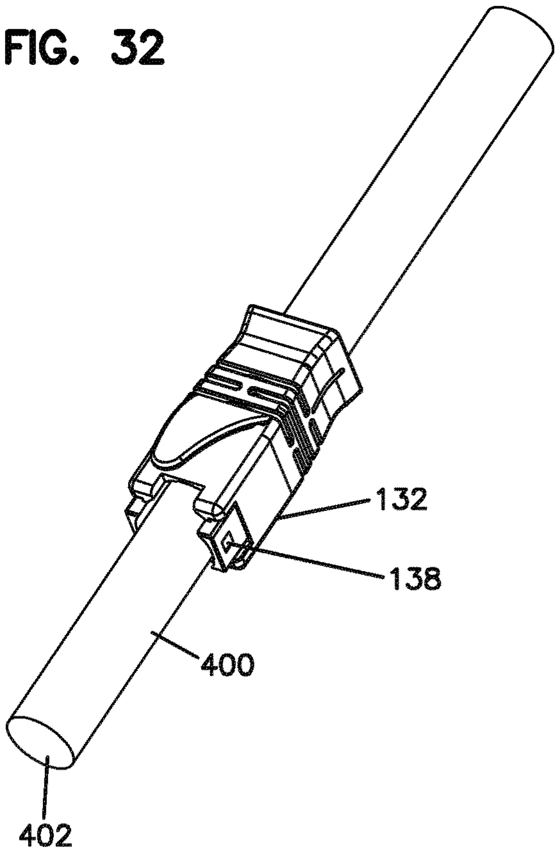
FIGS. 32-36 illustrate an example method of terminating an electrical cable to a connector with the shield illustrated in FIGS. 19-25.
Figure 33:
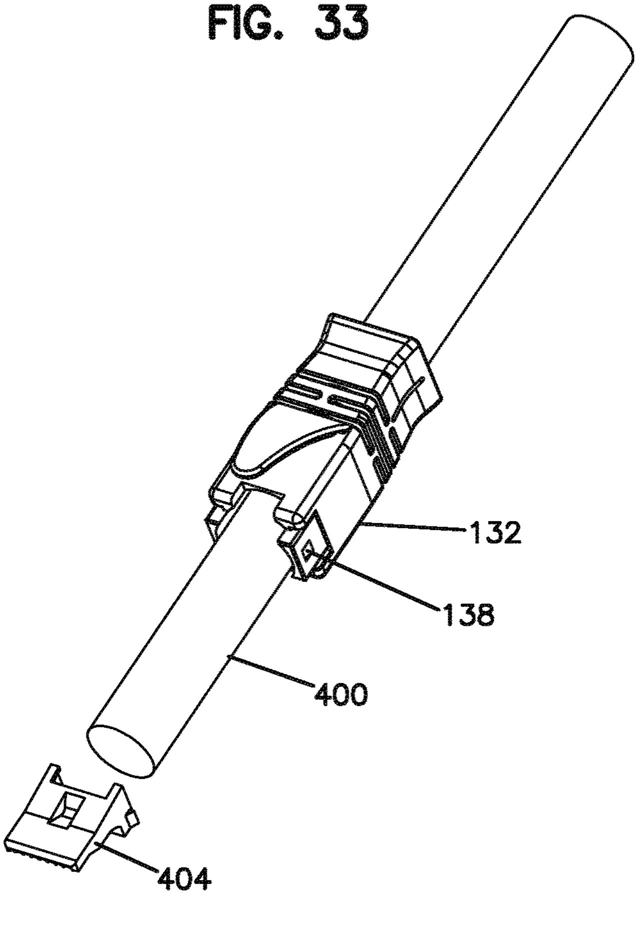

Referring now to FIGS. 4-12, the shield 102 is illustrated in isolation. In the depicted example, the shield 102 is formed from a single sheet metal structure 106 (as illustrated in FIG. 12). When formed, the shield 102 includes a main body portion 108 and a barrel portion 110 that is connected to the main body portion 108 by a flexible neck portion 112. The barrel portion 110, as will be described in further detail, is configured for crimping the metallic braid of a cable.

The barrel portion 110 defines a length L between a rear end 114 and a front end 116 of the barrel 110. In the depicted embodiment, the barrel 110 includes a corrugated side wall 118 made up of a series of bends 120 extending along a direction from the rear end 114 of the barrel 110 toward the front end 116 of the barrel 110 along at least a portion of the length L of the barrel 110. In the shield 102 of the present application, the bends 120 defining the corrugated side wall 118 are provided on the shield at a pre-crimped stage when initially manufacturing or forming the barrel 110. In the depicted example, the bends 120 defining the corrugated side wall 118 extend generally 360 degrees around the periphery of the barrel 110.

It should be noted that the term “corrugated” means the side wall is made up of a series of bends extending along a direction from the rear end of the barrel toward the front end of the barrel.

The barrel portion 110 of the shield illustrated in FIGS. 4-12 is defined by a unitary structure 122 with portions 124 that are in an overlapping position even when the shield 102 is at the pre-crimped stage. As noted above, this is different than a version of an inventive shield 302 that is shown in FIGS. 19-25 that defines a barrel made up of separate upper and lower barrel halves that are connected to the main body portion by separate upper and lower neck portions, wherein portions of the upper and lower halves are configured to come together and radially overlap when crimped against the braid of a cable.

It should be noted that the term “radial overlap” means that two sidewall portions of a generally tubular structure overlap along a direction extending outwardly from a common radius center defined by the sidewall portions.

Even though in the present application, the barrels of the different embodiments of the shields will be shown and described with respect to circular cylindrical structures, it should be noted that the inventive aspects such as the corrugation and the overlapping configurations are also applicable to other types of cylindrical structures, such as hexagonal cylinders.

Still referring to FIGS. 4-12, as noted above, the barrel 110 of the shield 102 is defined by a single/unitary structure 122 that is connected to the main body portion 108 of the shield 102 with the neck portion 112. The unitary barrel 110 includes portions 124 that are in an overlapping position even when the shield 102 is at the pre-crimped stage. Such an overlapping configuration provides a guiding function after the cable has been inserted through the barrel 110 and is ready to be crimped with a crimping tool or machine.

The main body 108 of the shield 102 defines a front end 126 and a rear end 128. At the rear end 128, the main body 108 defines coupling features 130 for mating with a flexible boot 132 of a cable as will be described in further detail later. Such a flexible boot 132 is shown in FIGS. 26-31. In the depicted example, the coupling features or mechanism 130 includes a pair of inwardly bent tabs 134 located at the sidewalls 136 of the main body 108 that are configured to be received within a pair of catches or detents 138 on the flexible boot 132. Depending upon the configuration of the flexible boot that is used with the cable or connector, such coupling features can be modified.

At the front end 126, the main body 108 defines a coupling feature 140 for mating with the plug housing 104. Again, depending upon the type of the plug housing 104 used, the coupling feature 140 may be different than the one illustrated. In the depicted example, the coupling mechanism 140 at the front end 126 of the main body 108 includes a flexible tab 142 that has been cut out of the main body portion 108 by a pair of longitudinally extending slits 144.

FIGS. 13-18 illustrate a shield 202 that defines a similar unitary barrel portion 210 as the shield 102 shown in FIGS. 4-12. However, as shown, the shield 202 of FIGS. 13-18 includes a different coupling mechanism 240 at the front end 226 of the main body 208 of the shield 202, wherein the coupling mechanism 240 is for mating the shield 202 with a different type of a conventional plug housing 204. The coupling mechanism 240 includes a pair of extensions or wings 242 that are configured to guide the shield 202 into the plug housing 204 of a connector 200, wherein a pair of inwardly bent tabs 244 at the sidewalls 236 of the main body 208 of the shield 202 can mate with detents or catches on such a connector 200. The pair of tabs 244 are in addition to the tabs 234 that are at the rear end 228 of the main body 208 used for coupling the shield 202 to a flexible boot 132.

Referring now to FIGS. 19-25, a third version of a shield 302 having features that are examples of inventive aspects in accordance with the present disclosure is illustrated. As noted above, the shield 302 of FIGS. 19-25 is different than the shields 102, 202 shown in FIGS. 4-18. While the shield 302 of FIGS. 19-25 shares similar plug housing coupling and flexible boot coupling features as the shield 202 shown in FIGS. 13-18, for example, the shield 302 of FIGS. 19-25 is different than both of the shields 102, 202 shown in FIGS. 4-18 in that the shield 302 defines a barrel 310 made up of separate upper and lower barrel halves 311, 313 that are connected to the main body 308 portion by separate upper and lower neck portions 315, 317. As will be described in further detail below, the upper and lower barrel halves 311, 313 are configured to allow a load bar to be inserted into the shield 302 through the barrel 310 after the load bar has been connected to wires of a cable. When the barrel 310 is ready to be crimped to the braid of the cable, the upper and lower halves 311, 313 are brought together. And, respective portions 319, 321 of the upper and lower halves 311, 313 radially overlap when fully crimped against the braid of a cable. The two-piece barrel 310 defined by the shield 302 of FIGS. 19-25 allows larger cables to be crimped to connectors 300 and allows a different termination technique where the wires can be pre-prepped within the load bar before insertion into the shield 302.

Even though the barrel 310 of the shield 302 of FIGS. 19-25 defines separate upper and lower halves 311, 313, the upper and lower halves 311, 313 still define corrugated side walls 318 made up of a series of bends 320 extending along a direction from a rear end 314 of the barrel 310 toward a front end 316 of the barrel 310 along at least a portion of the length L of the barrel 310. In the shield 302 of FIGS. 19-25, the bends 320 defining the corrugated side walls 318 are still provided on the shield 302 at a pre-crimped stage when initially manufacturing or forming the barrel 310. The bends 320 defining the corrugated side wall 318 extend generally 360 degrees around the periphery of the barrel 310 when the upper and lower halves 311, 312 are finally brought together during crimping.

Referring now to FIGS. 26-31, an example method of terminating an electrical cable 400 to a connector 100 with the shield 102 of FIGS. 4-12 is illustrated. In the example method, a flexible boot 132 is initially slid over an end 402 of the cable 400 that is to be terminated. Next, the jacket of the cable 400 is stripped to expose the metallic braid and the insulated wires of the cable. The braid is folded back and any foil that may be present on the individual wires is also removed. The shield 102 is then slid onto the cable 400, with the wires extending through the barrel 110 of the shield 102 from the rear end 114. The wires are then straightened and placed on a load bar 404 of the connector 100, which acts as a wire manager that frictionally holds the wires. In certain to embodiments of the connectors, the wires are ordered according to a color code and placed within the pockets defined within the load bar 404. The load bar 404 can also be used to make sure that the cable length is correct in terminating the cable 400 to the connector 100.

Once the individual wires are organized in the correct orientation and placed within the pockets of the load bar 404, the load bar 404 is positioned within the plug housing 104. The plug contacts are configured to provide electrical connection with spring contacts of a jack into which the connector 100 is plugged and provide an electrical pathway from the spring contacts to the wires of the cable 400.

Thereafter, the shield 102 is slid over the cable 400 toward the plug assembly 406 which is made up of a combination of the plug housing 104 and the load bar 404. The shield 102 is then mechanically coupled to the plug housing 104 using the intermating coupling features of the shield 102 and the plug housing 104. The barrel portion 110 of the shield 102 is then crimped on to the folded-over braid portion of the cable 400 to terminate the cable 400 to the connector 100. At the same time, the wires make electrical contact with plug contacts located within the plug housing 104 as discussed previously. Finally, the boot 132 can be slid over the end of the shield 102 and mechanically coupled to the shield 102 to complete the assembly of the terminated connector 100.

The shield 102 acts to provide strain relief for the cable 400 through the crimp. The shield 102 may also act to ground the braid of the cable 400.

In the illustrated method of FIGS. 26-31, the shield used is the version illustrated in FIGS. 4-12. The shield 102 is terminated to a plug housing 104 that includes coupling features that are configured to mate with the coupling features 140 of the shield 102 of FIGS. 4-12. As discussed above, in other embodiments, depending upon the plug housing used, different shields (such as the shield of FIGS. 13-18) and different coupling mechanisms may be used depending upon the plug assembly that is being assembled.

Referring now to FIGS. 32-36, an example method of terminating an electrical cable 400 to a connector 300 with the shield 302 of FIGS. 19-25 is illustrated. As described above, the shield 302 of FIGS. 19-25 defines a barrel 310 made up of separate upper and lower barrel halves 311, 313 that are connected to the main body portion 308 by separate upper and lower neck portions 315, 317. As noted above, the method of termination using such a shield 302 may be different than for a shield having a unitary barrel structure with a smaller-diameter.

According to the method illustrated in FIGS. 32-36, the flexible boot 132 is initially slid over the end 402 of the cable 400 that is to be terminated. Next, the jacket of the cable 400 is stripped to expose the metallic braid and the insulated wires of the cable 400. The braid is folded back and any foil that may be present on the individual wires is also removed. The wires are then straightened and placed on the load bar 404, which acts as a wire manager. In certain embodiments of the connectors, the wires are ordered according to a color code and placed within the pockets defined within the load bar 404. As noted above, the load bar 404 can also be used to make sure that the cable length is correct in terminating the cable 400 to the connector 300.

Figure 34:
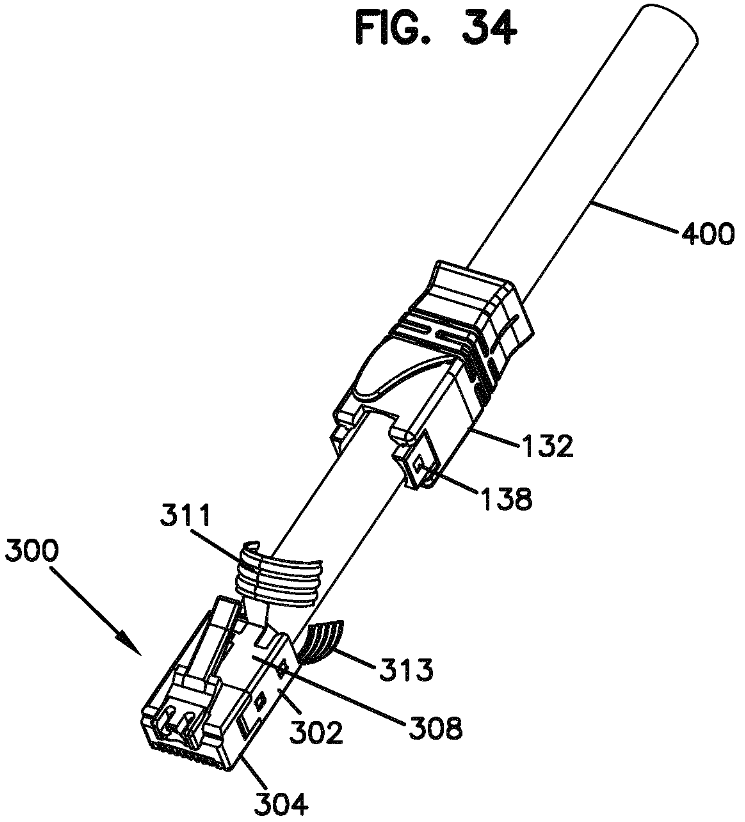
Figure 35:
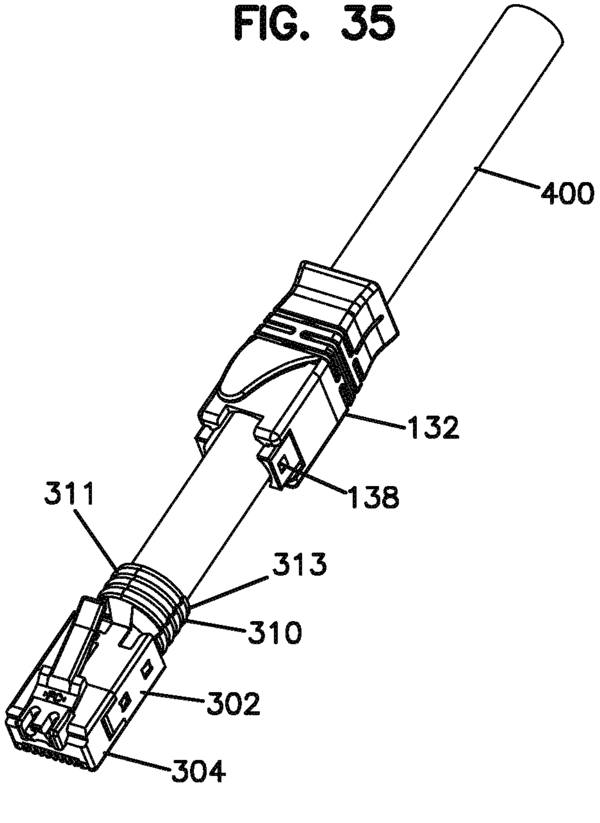
Figure 36:
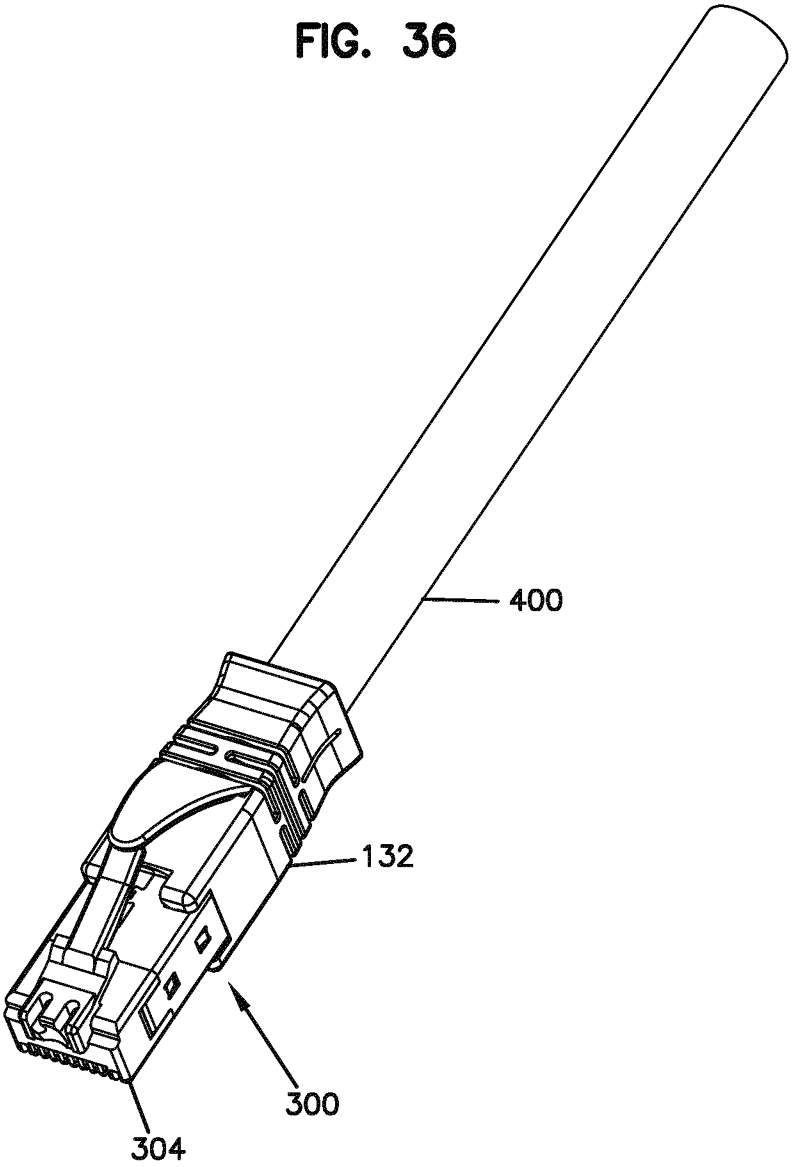

Once the individual wires are organized in the correct orientation and placed within the pockets of the load bar 404, the load bar 404 is passed through the barrel portion 310 of the shield 302 which has previously been coupled to the plug housing 304. As shown in FIG. 34, the upper and lower barrel halves 311, 313 are flexibly spread apart to receive the load bar 404 through the rear end 314 of the shield barrel 310 into the plug housing 304.

The plug contacts are configured to provide electrical connection with spring contacts of a jack into which the connector 300 is plugged and provide an electrical pathway from the spring contacts to the wires of the cable 400.

Once the load bar 404 has been passed through the barrel 310 and placed within the housing 304, the upper and lower halves 311, 313 of the barrel 310 are pre-closed manually, wherein portions of the upper and lower halves 311, 313 are brought to a radially overlapping position. Next, the upper and lower halves 311, 313 are fully crimped on to the folded-over braid of the cable 400 with a crimping tool or machine. At the same time, the wires make electrical contact with plug contacts located within the plug housing 104 as discussed previously. Finally, the boot 132 can be slid over the end of the shield 302 and mechanically coupled to the shield 302 to complete the assembly of the terminated connector 300.

The shield 302 acts to provide strain relief for the cable 400 through the crimp. The shield 302 can also act to ground the braid of the cable 400.

As noted above, different shields with different coupling mechanisms may be used for attachment to the plug housing depending upon the plug housing used.

Figure 37:
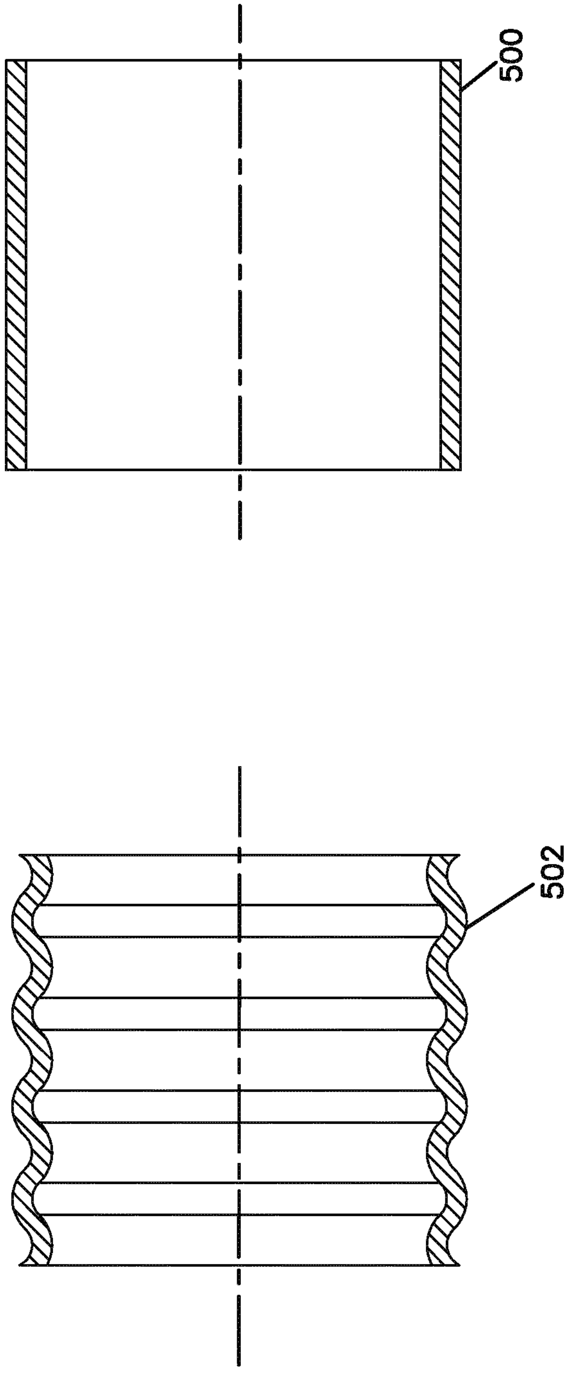
FIG. 37 diagrammatically illustrates the differences between a smooth sidewall and a corrugated sidewall with respect to the amount of material from a central deflection point in increasing the bending moment required to bend that material.
Figure 37A:

FIGS. 37 and 37A diagrammatically illustrate the differences between a smooth sidewall 500 and a corrugated sidewall 502 of a barrel with respect to the amount of material that is available from a central deflection point 504 for the sidewall. The corrugated sidewall 502, as seen, increases the bending moment required to bend the material forming the sidewall 502. As shown, the corrugated sidewall 502 provides an advantage from a strength standpoint since the entire thickness of the material forming the sidewall 502 accounts for the arm A of the bending moment. As shown in FIGS. 37 and 37A, in comparison, in a smooth, non-bent sidewall 500, only about half the wall thickness accounts for the bending arm A, making the sidewall 500 easier to bend under transverse loading.

Figure 38:
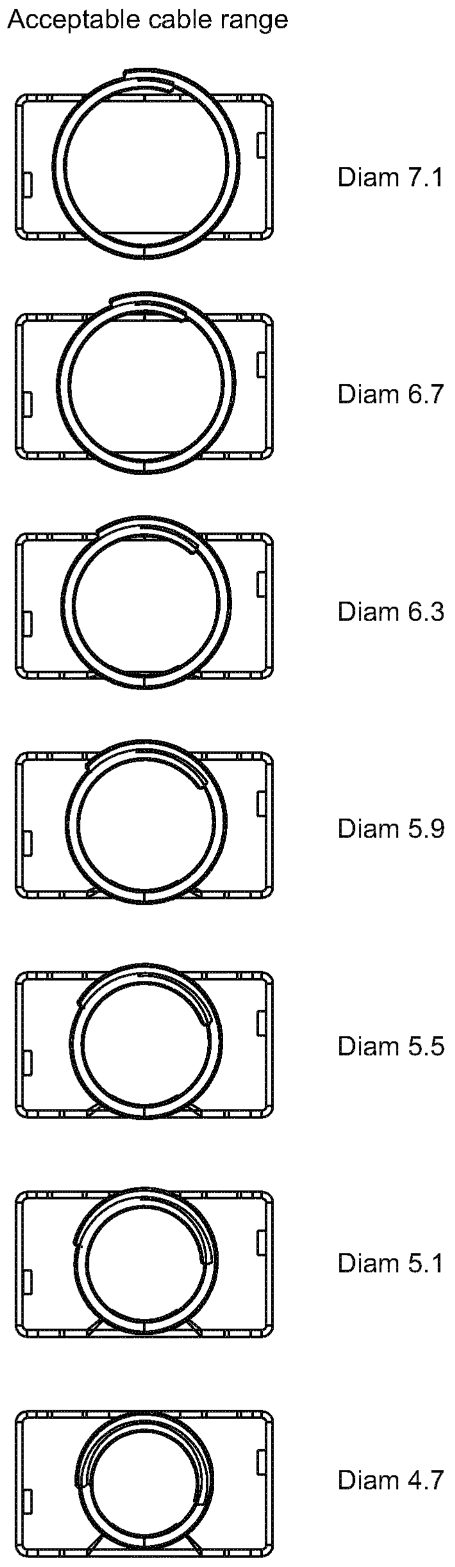
FIG. 38 illustrates the ability of the barrel of a shield such as the shields of FIGS. 4-25 to adapt to various cable diameter ranges.

The split or separated sidewall configuration of the barrel (as opposed to a fully closed cylindrical configuration found in conventional shields) provides flexibility in the sizes and types of cabling that may be terminated using the shields of the present disclosure. In such barrels with split or separated sidewalls, the corrugation, in addition to increasing strength, also provides guidance in forming the enclosed cylinder of the barrel. FIG. 38 illustrates the ability of a barrel of a shield that has a radially overlapping sidewall structure, such as in the shields 102, 202, 302 of FIGS. 4-25, to adapt to various cable diameter ranges in crimping the cables.

Although the depicted embodiments of the shields 102, 202, 302 are configured with certain mechanical coupling features for coupling to conventional plug housings, it should be noted that the coupling features are only exemplary and the shields 102, 202, 302 may be modified to include other types of coupling mechanisms depending upon the connectors and plug housings on which they are used. This modification also applies to different types of flexible boots used at the cable side.

Furthermore, it should be noted that although the present disclosure discusses electrical connectors and describes the inventive aspects of the different embodiments of the shields with respect to electrical connections, the inventive aspects are not limited to electrical connectors and are fully applicable to connections between fiber optic cables and fiber optic connectors or hybrid cables and hybrid connectors, wherein features such as protection against electro-magnetic interference, grounding, or strain relief might be utilized.

Moreover, it should be noted that although the present disclosure discusses the use of the shields 102, 202, and 302 for crimping against the metallic braid of a cable and the use of the shields 102, 202, and 302 in terminating shielded cables, the inventive aspects are fully applicable to crimping/terminating a variety of cables including shielded or non-shielded cables. In terminating non-shielded cables, the shields 102, 202, and 302 may be crimped over the cable jacket with the barrel portions surrounding the jacket of the cable.

The above specification, examples and data provide a complete description of the manufacture and use of the disclosure. Since many embodiments of the disclosure can be made without departing from the spirit and scope of the inventive aspects, the inventive aspects resides in the claims hereinafter appended.

What is claimed is:

1. A method of terminating a cable to a telecommunications connector, the method comprising:
- sliding a shield of the telecommunications connector over the cable that has a barrel portion defining a corrugated side wall made up of a series of bends extending along a direction from the rear end of the barrel portion toward the front end of the barrel portion along at least a portion of a length of the barrel portion, wherein the shield defines coupling features in the form of tabs located on opposing sidewalls of a main body portion of the shield that is separate from the barrel portion for mating with a pair of catches defined on a flexible boot of the cable; and
- crimping the barrel portion of the shield over the cable.

2. The method according to claim 1, wherein the telecommunications connector is an electrical connector and the cable includes a plurality of conductive wires.

3. A method of terminating a cable to a telecommunications connector, the method comprising:
- sliding a shield of the telecommunications connector over the cable that has a barrel portion defining a corrugated side wall made up of a series of bends extending along a direction from the rear end of the barrel portion toward the front end of the barrel portion along at least a portion of the length of the barrel portion, wherein the bends defining the corrugated side wall extend generally 360 degrees around the periphery of the barrel portion, wherein the shield defines coupling features in the form of tabs located on opposing side walls of a main body portion of the shield that is separate from the barrel portion for mating with a pair of catches defined on a flexible boot of the cable; and crimping the barrel portion of the shield over the cable.

4. The method according to claim 3, wherein the telecommunications connector is an electrical connector and the cable includes a plurality of conductive wires.

* * * * *